United States Patent
Mikeska et al.

(10) Patent No.: US 10,040,717 B1
(45) Date of Patent: Aug. 7, 2018

(54) THICK-FILM PASTE WITH MULTIPLE DISCRETE FRITS AND METHODS FOR CONTACTING CRYSTALLINE SILICON SOLAR CELL EMITTER SURFACES

(71) Applicants: Kurt R. Mikeska, Hockessin, DE (US); Meijun Lu, San Jose, CA (US); Feibiao Chen, Nanchang (CN)

(72) Inventors: Kurt R. Mikeska, Hockessin, DE (US); Meijun Lu, San Jose, CA (US); Feibiao Chen, Nanchang (CN)

(73) Assignee: Jiangxi Jiayin Science and Technology, Ltd., Nanchang, JX (CN)

( * ) Notice: Subject to any disclaimer, the term of this patent is extended or adjusted under 35 U.S.C. 154(b) by 0 days.

(21) Appl. No.: 15/708,055

(22) Filed: Sep. 18, 2017

(51) Int. Cl.
| | |
|---|---|
| *C03C 8/18* | (2006.01) |
| *C03C 8/14* | (2006.01) |
| *C09D 5/24* | (2006.01) |
| *H01B 1/16* | (2006.01) |
| *H01B 1/22* | (2006.01) |
| *H01L 31/0224* | (2006.01) |
| *H01L 31/0272* | (2006.01) |
| *H01L 31/05* | (2014.01) |
| *H01L 31/068* | (2012.01) |

(52) U.S. Cl.
CPC .............. *C03C 8/18* (2013.01); *C03C 8/14* (2013.01); *C09D 5/24* (2013.01); *H01B 1/16* (2013.01); *H01B 1/22* (2013.01); *H01L 31/0272* (2013.01); *H01L 31/022425* (2013.01); *H01L 31/05* (2013.01); *H01L 31/068* (2013.01)

(58) Field of Classification Search
CPC .. B22F 1/0059; B22F 7/04; B22F 7/08; B22F 1/007; C03C 8/10; C03C 8/12; C04B 35/01; H01B 1/16; H01B 1/22; H01L 31/022425; H01L 31/1884; H01L 31/0264
See application file for complete search history.

(56) References Cited

U.S. PATENT DOCUMENTS

| | | | |
|---|---|---|---|
| 8,187,505 B2 | 5/2012 | Carroll et al. | |
| 8,497,420 B2 * | 7/2013 | Carroll | B22F 1/0059 136/256 |
| 8,889,980 B2 | 11/2014 | Carroll et al. | |
| 8,895,843 B2 | 11/2014 | Carroll et al. | |
| 9,029,692 B2 * | 5/2015 | Wang | H01L 31/0264 136/256 |

(Continued)

OTHER PUBLICATIONS

C. W. Bale, E. Bélisle, P. Chartrand, S. A. Decterov, G. Eriksson, A.E. Gheribi, K. Hack, I. H. Jung, Y. B. Kang, J. Melançon, A. D. Pelton, S. Petersen, C. Robelin. J. Sangster and M-A. Van Ende, FactSage Thermochemical Software and Databases, 2010-2016, Calphad, vol. 54, pp. 35-53, 2016 <www.factsage.com>.

(Continued)

*Primary Examiner* — Noah S Wiese
(74) *Attorney, Agent, or Firm* — Stamoulis & Weinblatt LLC

(57) ABSTRACT

Devices, methods, and systems are described for thick-film paste with multiple discrete frits. The paste may be applied to contacting crystalline silicon solar cell emitter surfaces. Each frit contains both lead and tellurium. The described multiple discrete frit paste has superior solar cell performance compared with single frit pastes made from the individual discrete frits that make-up the multiple frit paste.

20 Claims, 4 Drawing Sheets

(56) References Cited

U.S. PATENT DOCUMENTS

| | | | |
|---|---|---|---|
| 2013/0049148 A1* | 2/2013 | Hang | C03C 8/10 |
| | | | 257/431 |
| 2015/0115207 A1* | 4/2015 | Shih | H01L 31/022425 |
| | | | 252/514 |
| 2016/0163895 A1* | 6/2016 | Yeh | C09D 5/24 |
| | | | 136/256 |
| 2017/0044050 A1* | 2/2017 | Booth | C03C 8/10 |

OTHER PUBLICATIONS

U.S. Appl. No. 14/224,917, filed Mar. 25, 2014, Diaz, Matthew R.

Electron microscopy study of front-side Ag contact in crystalline Si solar cells, Z. G. Li, L. Liang, and L. K. Cheng, Citation: J. Appl. Phys. 105, 066102 (2009); Published by the American Institute of Physics, Journal of Applied Physics 105, 066102 2009, pp. 1-4.

Microstructurel comparison of silicon solar cells' front-side Ag contact and the evolution of current conduction mechanisms, Z. G. Li,a) L. Liang, A. S. Ionkin, B. M. Fish, M. E. Lewittes, L. K. Cheng, and K. R. Mikeska DuPont Central Research & Development, Experimental Station, Wilmington, Delaware 19880-0500, USA (Received Jul. 6, 2011; accepted Aug. 15, 2011; published online Oct. 3, 2011), Journal of Applied Physics 110, 074304 (2011), pp. 1-9.

Role of the ambient oxygen on the silver thick-film contact formation for crystalline silicon solar cells, Sung-Bin Cho, et al., Department of Materials Science and Engineering, Korea University, Seoul 136-713, Republic of Korea, Solar Cell R&D Group, LG Electronics, Moonji-dong, Yuseong-gu, Daejeon 305-380, Republic of Korea, Current Applied Physics 10 (2010), pp. S222-S225.

Role of PbO-Based Glass Frit in Ag Thick-Film Contact Formation for Crystalline Si Solar Cells, Kyoung-Kook Hung, et al., Department of Materials Science and Engineering, Korea University, Seoul 136-713, Korea, Solar Cell R&D Group, LG Electronics, Moonji-dong, Yuseong-gu, Daejeon 305-380, Korea, (received date: Sep. 2, 2008 / accepted date: Nov. 17, 2008), Published Apr. 27, 2009. Met. Mater. Int., vol. 15, No. 2 (2009), pp. 307-312.

The formation mechanism for printed silver-contacts for silicon solar cells, Jeremy D. Fields, et al., Received Oct. 15, 2015, Accepted Feb. 25, 2016, Published Apr. 1, 2016, DOI: 10.1038/ncomms11143, Nature Communications, pp. 1-7.

Weiwei, Deng & Chen, Daming & Xiong, Zhen & Verlinden, Pierre & Jianwen, Dong & Ye, Feng & Li, Hui & Zhu, Huijun & Zhong, Ming & Yang, Yang & Chen, Yifeng & Feng, Zhiqiang & Altermatt, Pietro. 20.8% PERC Solar Cell on 156 mm x 156 mm P-Type Multicrystalline Silicon Substrate. IEEE Journal of Photovoltaics, vol. 6, issue 1, Jan. 2016.

Screen-Printed Silver Contact Mechanisms, Kurt R. Mikeska, et al., Email: kurt.r.mikeska@usa.dupont.com, DuPont Central Research and Development, Wilmington, DE 19880-0304 USA, DuPont Electronic Technologies, Research Triangle Park, NC 27709 USA, 28th European Photovoltaic Solar Energy Conference and Exhibition, pp. 39-42, Paris, France (Oct. 2013).

Front-Side Ag Contacts Enabling Superior Recombination and Fine-Line Performance, M. Z. Burrows, et al., DuPont Innovalight, Sunnyvale CA, USA, DuPont Microcircuit Materials, Research Triangle Park, NC, USA, DuPont Central Research and Development, Wilmington, DE, USA, 2013 IEEE, pp. 2171-2175, (Jun. 2013).

New Thick Film Paste Flux for Contacting Silicon Solar Cells, Kurt R. Mikeska, Zhigang Li, Paul D. VerNooy and Liang Liang, DuPont Central Research and Development, Experimental Station, P.O. Box 80304, Wilmington, DE 19880-0304, Email: kurt.r.mikeska@usa.dupont.com, Alan F. Carroll, DuPont Electronic Technologies, 14 T. W. Alexander Drive, Research Triangle Park, NC 27709, Jessica Chou and Karu Shih, DuPont Electronic Technologies, DuPont Taiwan Ltd, 45 Hsing Pont Road, Taoyuan, Taiwan 330, ROC, 26th European Photovoltaic.

Thick Film Pastes for Contacting Homogeneous Lightly Doped N-Type Emitters [Continued below] Enabling High Blue Light Response, Kurt R. Mikeska, et al., Email: kurt.r.mikeska@usa.dupont.com, DuPont Central Research and Development, Wilmington, DE 19880-0304 USA, DuPont Innovalight, Inc., Sunnyvale, CA 94085 USA, DuPont Electronic Technologies, Research Triangle Park, NC 27709 USA, 27th European Photovoltaic Solar Energy Conference and Exhibition, pp. 1717-1721, Frankfurt Germany (Sep. 2012).

Microstructural Characterization of Front-Side Ag Contact of Crystalline Si Solar Cells with Lightly Doped Emitter, Z. G. Li, et al., DuPont Central Research and Development, Wilmington, DE 19880-0500, DuPont Innovalight, Sunnyvale, CA 94085, DuPont Electronic Technologies, Research Triangle Park, NC 27709, National Renewable Energy Laboratory, Golden, CO 80401, 2011 IEEE, pp. 002196-002199, (Jun. 2012).

* cited by examiner

THICK-FILM PASTE WITH MULTIPLE DISCRETE FRITS AND METHODS FOR CONTACTING CRYSTALLINE SILICON SOLAR CELL EMITTER SURFACES

BACKGROUND OF THE INVENTION

1. Field of the Invention

The present invention relates generally to the manufacture of solar cells, and more importantly, to an electro-conductive thick-film, screen-printable paste for printing electrodes on crystalline silicon solar cell emitter surfaces.

2. Background

A photovoltaic (PV) solar cell is generally a semiconductor device that converts solar energy into electrical energy, and has been recognized as an infinite, clean, renewable next-generation energy source. PV solar cells generate direct electrical current, which flows to an external electrical circuit load through electrodes, or electrically conductive metallizations. Crystalline silicon PV solar cell conductor metallizations based on silver thick-film, front-contact screen printing techniques are common in the crystalline silicon solar cell industry because of their low cost, high throughput, and relatively high performance.

Current industrial scale screen printed, phosphorus-doped n-type emitter, front junction p-type multi-crystalline silicon solar cells have efficiencies of approximately 18.5%. Current mono-crystalline silicon p-type solar cells have efficiencies of approximately 19.5%. Recent improvements in conductor metallizations have enabled the solar cell industry to commercialize advanced, high efficiency cell architectures, which in turn, have resulted in a steady incremental increase in solar cell efficiency.

The solar cell industry has an efficiency performance metric that defines solar cell efficiency improvement as about a tenth of a percent increase in cell or module absolute efficiency. A new metallization paste that delivers an increase in solar cell absolute efficiency of about a tenth of a percent or greater than baseline efficiency will be implemented by solar cell manufactures. Such incremental efficiency increases are essential for the solar cell industry to continue increasing cell and module efficiency.

A thick-film, screen-printable metallization paste for solar cell applications may consist of an organic medium or vehicle, metallic particles, an inorganic frit, and additives. For the case of a front-side solar cell conductor, the paste is screen printed onto the front-side of a silicon wafer, dried at moderate temperature, and then rapidly fired at relatively high temperature (~800° C.) in an infrared belt furnace. During the high temperature firing step, the frit forms a highly wetting liquid phase flux that helps sinter the metal particles and etches through an electrically insulating $SiN_x$:H antireflective coating (ARC) to allow the metallic conductor, e.g., silver, to make electrical contact with the underlying silicon emitter.

Interfacial films form between the bulk silver conductor and silicon emitter during the firing process from dissolution of the $SiN_x$:H layer and migration of the liquid phase flux and $SiN_x$:H reaction products to the interface region. Electrical contact is thought to occur by an electron tunneling process through the interfacial films. The quality of the electrical contact depends on the chemistry of the starting inorganic frit. The frit also acts to adhere the conductor metal to the silicon wafer.

Early generation screen printable pastes contained frits based on lead-silicate (Pb—Si—O) chemistries. More current generation pastes contain tellurite (Te—O) and lead-tellurite (Pb—Te—O) based frits. The early generation lead-silicate-based metallization pastes required p-type silicon wafers with highly doped n-type emitters (HDE), which have a surface concentration $(N_D)=\sim 8\times 10^{20}$ cm$^{-3}$ and sheet resistivities <90 ohm/sq., for the metallizations to have sufficiently low contact resistivity.

The introduction of lead-tellurite based metallizations was a step-change improvement in contact resistivity that allowed the solar cell industry to utilize lightly doped emitters (LDE), which have $N_D=\sim 1\text{-}2\times 10^{20}$ cm$^{-3}$ and sheet resistivities >90 ohm/sq., and which have much lower recombination velocities and lower saturation currents, and subsequently higher solar cell efficiencies. Low contact resistivity metallizations on LDE wafers have more recently allowed the industry to commercialize advanced solar cell architectures such as passivated emitter rear contact (PERC).

In order for front-surface conductor metallization to achieve low contact resistivity, the ARC under the conductor line must be removed (dissolved/etched) during the firing process. Usually the ARC is a plasma-enhanced chemical vapor deposition (PECVD) $SiN_x$:H layer that is typically ~70 nm thick. This is because the ARC is an insulating layer that prevents current transport from the emitter to the bulk silver conductor during solar cell operation. A low contact resistivity of less than about 2 mΩ-cm$^2$ is required for low series resistance and high fill factor.

During the firing process, the frit in the metallization paste forms a low viscosity liquid-phase flux which migrates by capillary action to the silver-silicon interface region where it facilitates the dissolution of the $SiN_x$:H ARC layer. The primary chemical reaction for the dissolution process during firing is the following redox reaction:

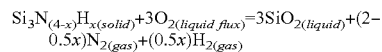

During the firing process, the $SiO_2$ reaction product dissolves into the interfacial liquid to expose a fresh surface of $SiN_x$:H for subsequent oxidation and dissolution. Hydrogen and nitrogen are gaseous reaction products. The ARC dissolution process continues until the ARC is removed from the interface, exposing the silicon emitter layer. The ΔG (Gibbs free energy of reaction) for the above reaction is −426 kcal, which is a high reaction driving force. Silver that dissolves into the liquid phase flux during firing, and other metals, such as lead, that may be in the starting frit can also act to help drive the ARC dissolution process as shown below.

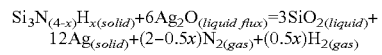

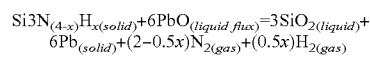

Both reactions are thermodynamically quite favorable, with ΔGs of −477 kcal and −263 kcal, respectively, which again are high driving forces. In the case of tellurite based frits, tellurium oxide along with other soluble metals in the liquid phase can react with the ARC as shown below:

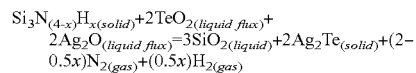

The ΔG for this reaction is −409 kcal, which again is thermodynamically favorable.

The final interfacial films are composite layers containing reaction products from dissolution of the $SiN_x$:H layer and migration of the liquid-phase flux materials to the interface region during the firing process. The quality of the resulting electrical contact between the semiconductor and metal conductor is determined by the starting chemistry of the inorganic frit.

The frit chemistry must be designed to take full advantage of the theoretical performance of the solar cell. It must etch through the ARC to maximize contact between the metal and semiconductor without damaging the underlying emitter layer, which results in high recombination losses and a reduction in both open circuit voltage ($V_{OC}$) and short circuit current ($I_{SC}$). There is often a trade-off in frit chemistry design between aggressively etching the ARC to achieve low contact resistance, and thus, low series resistance, while simultaneously not damaging the underlying emitter layer and causing a reduction in saturation current ($J_0$). This is especially true for tellurium based frits where low contact resistance is often accompanied by a reduction in $J_0$ parameters.

To achieve additional solar cell efficiency improvements, new metallization pastes with chemistries may be developed that may be precisely fine-tuned to extract the theoretical performance of the solar cell. Prior art pastes have chemistries that cannot be fine-tuned to the precision required to achieve additional solar cell efficiency improvements especially for advanced solar cell architectures.

Prior art in the area of screen print metallization pastes for crystalline silicon solar cells describes pastes containing inorganic frit systems. Early prior art describes pastes comprising frit systems based on lead-silicate chemistries, where pastes contain a single discrete frit, such as described in U.S. Pat. No. 8,187,505. These pastes, due to their inherent starting frit chemistry deficiencies, were inhibited in their ability to effectively contact silicon solar cell emitter surfaces, thereby limiting solar cell performance.

Other pastes were subsequently developed comprising frits systems based on lead-tellurium chemistries. These pastes were a step change improvement in the ability to effectively contact emitter surfaces compared to pastes comprising lead-silicate based frit systems, thus improving solar cell performance. Other metal cations are necessary to fine-tune the frit chemistry, but tellurium is the crucial chemical component.

Lead-free tellurium based frits were developed to meet future crystalline solar cell Restriction of Hazardous Substances (RoHS) directives. Current crystalline silicon solar cells RoHS directives do not restrict the use of lead in metallization pastes. Therefore, the industry continues to use pastes that contain lead compounds.

Prior art one frit pastes based on lead-tellurium chemistries are limited in the control of the ARC dissolution reactions that occur during the solar cell firing process. This is because a one frit system is inherently limited in the range of chemical constituents within the single starting frit. This limits the control of the subsequent ARC dissolution reactions during firing. This, in turn, limits the quality of the resulting electrical contact between the semiconductor and metal conductor and the theoretical performance of the solar cell.

Prior art two frit pastes describe pastes where one frit contains lead chemistries and is tellurium-free and one frit contains tellurium chemistries and is lead-free. U.S. Pat. No. 9,029,692 describes two frit pastes where one frit is a tellurium containing composition that is substantially lead-free, and the other frit is a lead containing composition that is substantially tellurium-free. U.S. Pat. No. 9,029,692 discusses in the specifications that substantially lead-free is a frit containing less than about 10 weight percent lead oxide and substantially tellurium-free is a frit containing less than about 10 weight percent tellurium oxide.

U.S. patent application Ser. No. 14/224,917 describes two frit pastes where one frit is lead free and the other frit comprises lead and tellurium with a composition which comprises 10 to 45 weight percent lead oxide, from 54 to 89 weight percent tellurium oxide and 1 to 10 weight percent zinc oxide.

SUMMARY OF THE INVENTION

In one aspect, an electro-conductive thick-film, screen-printable paste includes an inorganic frit system including a first discrete frit including lead (Pb) and tellurium (Te);a second discrete frit including lead and tellurium; wherein the inorganic frit system includes a mixture in which the first discrete frit includes $0<Te\leq0.45$ and the second discrete frit includes $0.55\leq Te<1$ wherein Te is the mole fraction of tellurium cations based on a total number of moles of lead and tellurium cations in each respective discrete frit.

The paste may include more than two discrete frits. The paste may include a conductive metal powder. The tellurium may be a tellurium oxide and the lead may be a lead oxide. The mixture may include $0<Te\leq0.05$ and $0.95\leq Te<1$ for the first and second discrete frits, respectively. The mixture may include $0<Te\leq0.10$ and $0.90\leq Te<1$ for the first and second discrete frits, respectively.

The mixture may include $0<Te\leq0.15$ and $0.85\leq Te<1$ for the first and second discrete frits, respectively. The mixture may include $0<Te\leq0.20$ and $0.80\leq Te<1$ for the first and second discrete frits, respectively. The mixture may include $0<Te\leq0.25$ and $0.75\leq Te<1$ for the first and second discrete frits, respectively. The mixture may include $0<Te\leq0.30$ and $0.70\leq Te<1$ for the first and second discrete frits, respectively.

The mixture may include $0<Te\leq0.35$ and $0.65\leq Te<1$ for the first and second discrete frits, respectively. The mixture may include $0<Te\leq0.40$ and $0.60\leq Te<1$ for the first and second discrete frits, respectively. The first discrete frit and second frit may comprise a tellurium-lead-metal-oxygen composition of $$\left[Te_x(Pd_yM_zM'_{z'}M^i_{z^i})_{(1-x)}\right]^{n+}O_{\frac{n+}{2}},$$

wherein $0<z\leq0.6$ and z is the mole fraction of metal (M) cations based on the total number of moles of lead, tellurium and metal cations, respectively, selected from one of Li, Na, K, Rb, Cs, Mg, Ca, Sr, Ba, B, Al, Si, P, Sc, Ti, Cr, Mn, Fe, Co, Ni, Cu Zn, Ga, Ge, Y, Zr, Nb, Mo, Ru, Pd, Ag, In, Sn, Sb, Hf, Ta, W, Pt, Au, Bi, La and the other lanthanide elements and mixtures thereof, The inorganic frit system may comprise metal cations including one of oxides, halides and fluorides. The powder may include at least a portion of silver. One or more of the discrete frits may comprise 0.3 to 10 weight percent based on a total amount of solids of the paste. The first discrete frit and second discrete frit may be mixed in ratios ranging from 99:1 to ratios ranging from 1:99 and mixtures thereof based on a total amount of discrete frits in the paste In another aspect, an organic medium including one of an organic vehicle and additive with an electro-conductive thick-film, screen-printable paste is described. In another aspect, a photovoltaic cell comprising an electro-conductive thick-film, screen-printable paste is described. In another aspect, an article comprising a photovoltaic module having been formed using the photovoltaic cell is described.

BRIEF DESCRIPTION OF THE DRAWINGS

The advantages of the invention and preferred embodiments are more fully understood by referencing the following detailed descriptions of the drawings.

Figure 1:
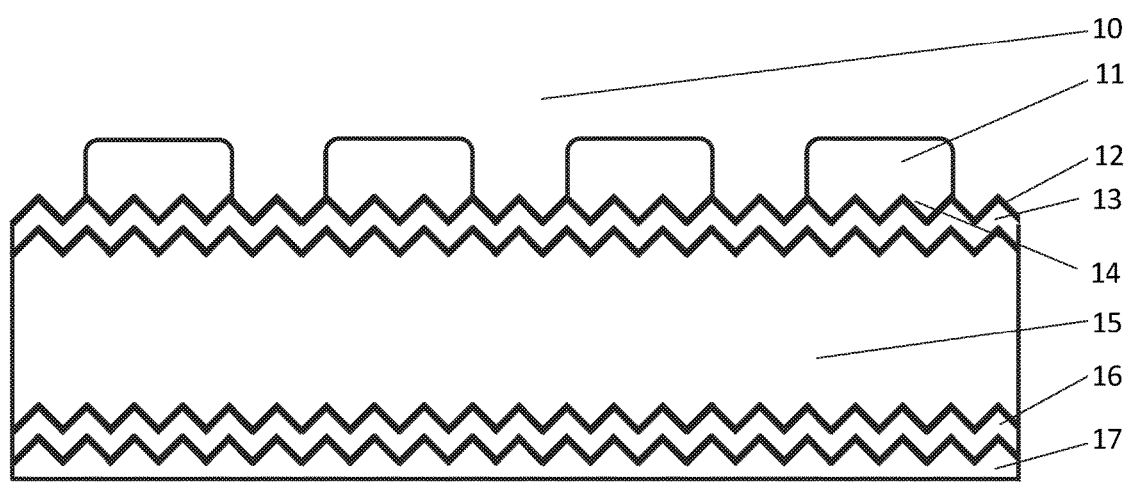
FIG. 1 is a cross section diagram of a front-contact, p-type crystalline silicon solar cell.

$$\sum_{i=1}^{n} \text{Frit } i = \text{Frit } 1 + \text{Frit } 2 + \ldots \text{Frit } n, \text{ where } i = 1$$

through n and n is the number of frits.

DETAILED DESCRIPTION

Each of the additional features and teachings disclosed below can be utilized separately or in conjunction with other features and teachings to provide a device, system, and/or method for thick-film paste with multiple discrete frits. In one embodiment, the paste may be applied to contacting crystalline silicon solar cell emitter surfaces. Representative examples of the present invention, which examples utilize many of these additional features and teachings both separately and in combination, will now be described in further detail with reference to the attached drawings. This detailed description is merely intended to teach a person of skill in the art further details for practicing preferred aspects of the present teachings and is not intended to limit the scope of the invention. Therefore, combinations of features and steps disclosed in the following detail description may not be necessary to practice the invention in the broadest sense, and are instead taught merely to particularly describe representative examples of the present teachings.

Moreover, the various features of the representative examples and the dependent claims may be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

Devices, methods, and systems are described for thick-film paste with multiple discrete frits. In one embodiment, the paste may be applied to contacting crystalline silicon solar cell emitter surfaces. In one embodiment, each frit contains both lead and tellurium. In one embodiment, multiple frits may be used. In one embodiment, two or more frits may be used. In one embodiment, three or more frits may be used. In one embodiment, the described multiple discrete frit paste has superior solar cell performance compared with single frit pastes made from the individual discrete frits that make-up the multiple frit paste. Examples of the paste are shown in the following examples.

In another embodiment, the multiple lead-tellurium discrete frit paste has superior solar cell performance compared to two frit pastes where one frit is a lead-tellurium frit and the other is a lead-free frit. One example of this may be found in example 7. The examples also show a performance improvement metric that is measured in tenths of a percent absolute efficiency.

The electro-conductive thick-film, screen-printable paste compositions are useful for printing front-side electrodes on crystalline silicon solar cell emitter surfaces, and the like. Other applications may include screen-printable paste compositions for printing electrodes for hybrid circuits applications, and the like.

In an embodiment, an electro-conductive thick-film, screen-printable paste for printing electrodes on crystalline silicon solar cell emitter surfaces is disclosed. The thick-film paste may include: an inorganic frit system, an electrically conductive metal powder, and an organic medium. The inorganic frit system may include two, three or more discrete inorganic lead-tellurium based frits. The electrically conductive metal powder may include a metal, such as silver or silver in combination with other conductive metals, such a nickel and copper. The frits and metal powder may be dispersed in an organic medium to form a thick-film, screen-printable paste.

The inorganic frit system addresses the need to control and fine-tune the frit chemistry in metallization pastes to maximize the global performance of the solar cell. The ability to precisely control frit chemistry is especially important for pastes designed to contact advanced solar cell architectures such as Passivated Emitter Rear Contact (PERC), Passivated Emitter Rear Locally Diffused (PERL), Passivated Emitter Rear Totally Diffused (PERT), etc. where final solar cell efficiency is much more dependent on extracting the theoretical performance of the cell. The disclosed paste compositions may be used to manufacturer front-contact, crystalline silicon solar cells with improved performance.

In one embodiment, a method for manufacturing or producing a PV cell is also disclosed and includes a (crystalline silicon) PV cell having been formed using the electro-conductive thick-film, screen-printable paste.

FIG. 1 is a cross section diagram of a front-contact, crystalline silicon solar cell showing details of the solar cell 10 in an embodiment. The cell 10 may include front-side silver grid lines 11, an antireflective coating ($SiN_x$:H) 12, a phosphorus doped $n^+$ emitter 13, a silver-emitter electrical contact interface 14, a p-type crystalline silicon wafer 15, a $p^+$ back surface field 16, and a back-side aluminum metallization 17. In one embodiment, the front-side Ag conductor line may be in electrical contact with the underlying emitter surface.

Figure 2:
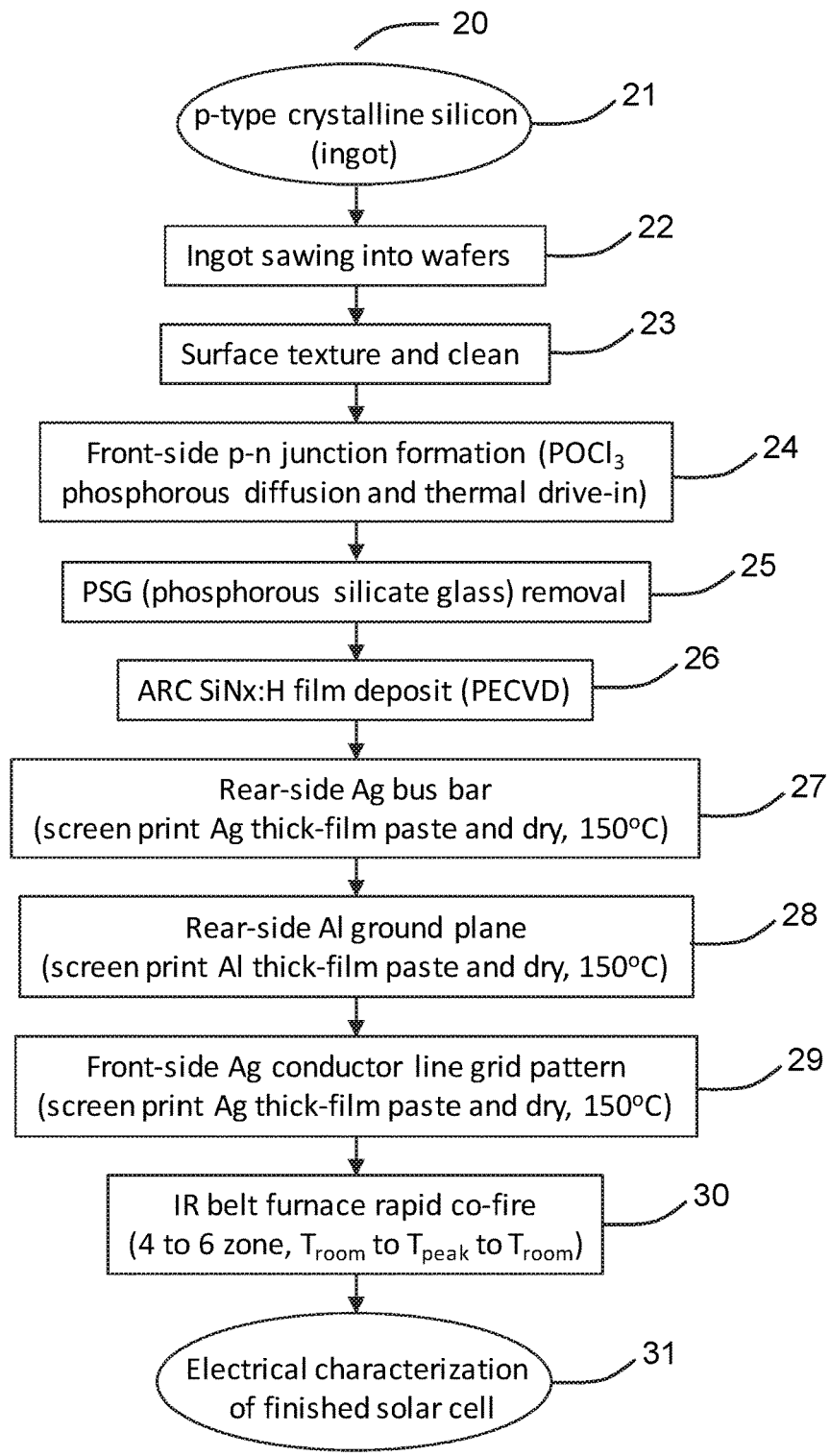
FIG. 2 is a process flow diagram for industrial manufacturing of a p-type crystalline silicon solar cell.

FIG. 2 is process flow diagram 20 for industrial manufacturing of a p-type crystalline silicon solar cell. In step 21, a p-type crystalline silicon ingot may be provided. In step 22, the ingot may be sawed into wafers. In step 23, the wafer surface may be textured and cleaned. In step 24, a front-side junction may be formed by PECVD phosphorus ($POCl_3$) diffusion and thermal drive-in. In step 25, phosphorus silicate glass (PSG) may be removed. In step 26, the front-surface SiN$_x$:H ARC by PECVD may be deposited. In step 27, the rear-surface silver bus bar may be screen printed on the rear surface using rear-side silver bus bar paste. In step 28, the rear-surface aluminum ground plane may be screen printed on the rear surface using rear-side aluminum paste. In step 29, the front-surface silver conductor line grid pattern may be screen printed using front-side silver paste. In step 30, the screen printed wafer may be rapidly co-fired in an IR belt furnace. In step 31, an electrically characterized finished solar cell is provided. In one embodiment, the solar cell manufacturing process is the screen-printed Ag conductor line grid pattern on the front surface of the solar cell. n one embodiment, a crystalline Si solar cell may be formed using the disclosed electro-conductive thick-film, screen-printable paste.

Figure 3:
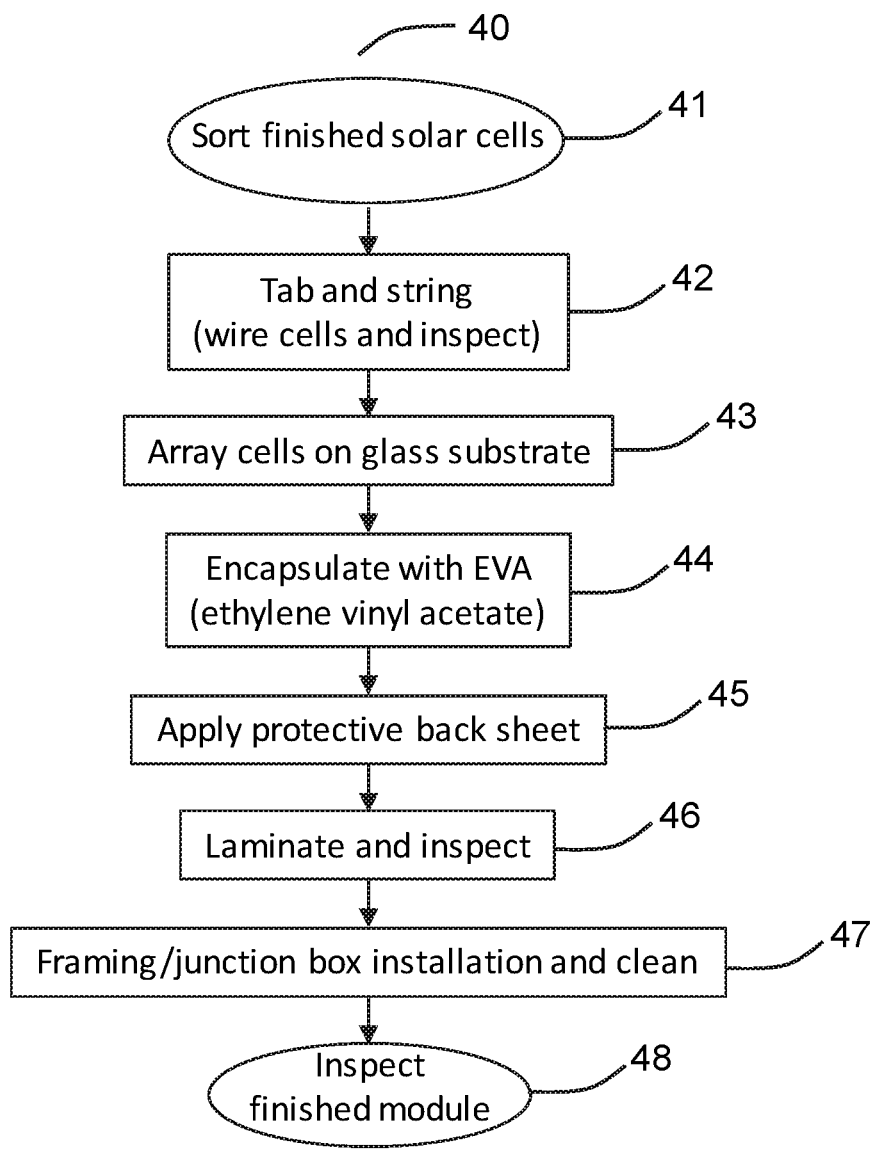
FIG. 3 is a process flow diagram for industrial manufacturing of crystalline silicon solar cell module.

In another embodiment, a process for producing a PV module comprising a photovoltaic module having been formed using (crystalline silicon) PV cells is described. FIG. 3 is a process flow 40 for industrial manufacturing of crystalline silicon solar cell module or panel. In step 41, finished crystalline silicon solar cells may be sorted. In step 42, the solar cells may be tabbed, strung and inspected. In step 43, an array of solar cells on a glass substrate may be provided. In step 44, the solar cell array may be encapsulation with ethylene-vinyl acetate (EVA). In step 45, a protective back-sheet may be applied. In step 46, the solar cell array may be laminated and inspected. In step 47, the module may be framed, cleaned and junction box may be installed. In step 48, the finished module may be inspected.

The solar cell module manufacturing process is the crystalline silicon solar cells may be formed using a screen print Ag paste. In one embodiment, a solar cell module may be formed using crystalline silicon solar cells having been formed using the disclosed electro-conductive thick-film, screen-printable paste.

a) The Inorganic Frit System

In one embodiment, an inorganic frit system for use, for example, in an electro-conductive thick-film, screen printable paste for printing front-side electrodes on crystalline silicon solar cell emitter surfaces is described. The inorganic frit system comprises two, three or more (multiple) discrete frits, each containing tellurium and lead dispersed in the paste such that the paste comprises multiple discrete frits. A discrete frit may be defined as a frit that is separate and different in chemistry from the other frits in the inorganic frit system and in the final screen print paste. As defined herein, a multiple discrete frit system comprises two, three or more discrete frits such that $$\sum_{i=1}^{n} \text{Frit } i = \text{Frit } 1 + \text{Frit } 2 + \ldots \text{Frit } n, \text{ where } i = 1$$

through n and n is the number of frits.

The multiple discrete frit system, during the high-temperature firing step, forms a liquid phase flux that etches through the electrically insulating SiN$_x$:H antireflective coating (ARC) of the solar cell to allow the metallic silver conductor in the paste to make a low contact resistivity electrical contact with the underlying silicon emitter layer with minimal damage to the emitter layer The multiple discrete frit system when used in a thick-film, screen printable paste to print front-side solar cell electrodes (e.g., silver) improves overall solar cell performance by approximately a tenth of a percent absolute efficiency or more.

The multiple discrete frit system enables a wider range and more precise control of chemical compositions in the etching flux formed at high temperature during solar cell firing compared to existing pastes. In one embodiment, during the firing process of a screen printed solar cell, the individual frits of the multiple discrete frit system simultaneously melt, fuse, and combine to form a liquid phase flux that etches through the electrically insulating SiN$_x$:H anti-reflective coating (ARC) of the solar cell. A multiple discrete frit system allows for a wider range and more precise control of chemical compositions in the liquid phase flux pastes containing frit systems with only one or two frits. This improves the ability of the liquid phase flux to react with and etch through the electrically insulating SiN$_x$:H antireflective coating of the solar cell and contact the underlying silicon emitter, thereby reducing the contact resistivity of the fired electrode without damaging the underlying emitter layer.

The multiple discrete frit system also acts as an adhesion medium to adhere the conductor line to the underlying semiconductor substrate, thereby ensuring the lifetime reliability of the solar cell device.

The multiple discrete frit system may comprise frits with amorphous, crystalline, or partially crystalline phases. It may comprise frits with various compounds including, but is not limited to, oxides, fluorides, chlorides or salts, alloys, and elemental materials.

In an embodiment, the multiple discrete frit system comprises two, three or more inorganic frits containing combinations of lead and tellurium. The tellurium may be tellurium oxide and the lead may be lead oxide. In another embodiment, the discrete frits comprise frits with amorphous, crystalline, or partially crystalline phases and mixtures thereof.

In an embodiment, the inorganic frit system comprises a mixture of two, three or more discrete frits that are mixed into a paste in ratios ranging from 99:1 to 1:99 and mixtures thereof, based on the total amount of discrete frits. In one example, a paste with two discrete frits, the ratios of frit 1 to frit 2 may range from 99:1 to 1:99. For a paste with three frits or more, the mixture ratios may be combinations from 99:1 and 1:99.

In an embodiment, the discrete frits comprise a tellurium-lead-metal-oxygen composition of Formula 1;

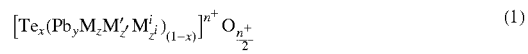
(1)

Wherein x is the mole fraction of tellurium (Te), y is the mole fraction of lead (Pb), z is the mole fraction of metal cations (M) and n$^+$ is the valance number of the tellurium, lead, and metal cations. In an embodiment, 0<z≤0.6 and z is the mole fraction of metal cations based on the total amount of lead, tellurium, and metal cations. The metal cations may include M$_z$, M$_{z'}^i$, ... M$_{z'}^i$ is selected from one of Li, Na, K, Rb, Cs, Mg, Ca, Sr, Ba, B, Al, Si, P, Sc, Ti, Cr, Mn, Fe, Co, Ni, Cu Zn, Ga, Ge, Y, Zr, Nb, Mo, Ru, Pd, Ag, In, Sn, Sb, Hf, Ta, W, Pt, Au, Bi, La and the other lanthanide elements and mixtures thereof. In another embodiment, the metal cations comprise oxides, halides or fluorides.

In another embodiment, the discrete frits comprise a composition of formula 1 wherein 0<Te≤0.05 in which Te is the fractional amount of tellurium based on the total amount of lead and tellurium cations. In another embodiment, the discrete frits comprise a composition of formula 1 wherein $0.95 \leq Te<1$ in which Te is the fractional amount of tellurium based on the total amount of lead and tellurium cations.

In an embodiment, the individual discrete frits are dispersed into the paste forming a paste comprising multiple discrete frits. Separate discrete frits with $0<Te \leq 0.05$ and separate discrete frits with $0.95 \leq Te<1$ are dispersed into the paste in various proportions or ratios forming a paste comprising two, three or more discrete frits mixed in various ratios.

In another embodiment, the discrete frits are mixed into a paste in ratios ranging from 99:1 to ratios ranging from 1:99 and mixtures thereof, based on the total amount of discrete frits.

In an embodiment, during the firing process the two, three or more discrete frits simultaneously melt, fuse, and combine to form a liquid phase flux with a chemistry that is a combination of the separate discrete frits. The combined chemistry is determined by the starting chemistry of the separate discrete frits (e.g., separate discrete frits with $0<Te \leq 0.05$ and separate discrete frits with $0.95 \leq Te<1$) and by the proportion or ratio of each discrete frit dispersed in the paste. The liquid phase flux with the combined chemistry of the discrete frits etches through the electrically insulating $SiN_x:H$ antireflective coating of the solar cell to make a low resistivity contact with minimal damage to the underlying silicon emitter layer.

In one example, a paste with two discrete frits wherein, one discrete frit with $z=0.6$ and $Te=0.05$ (where Te is the fraction amount of tellurium based on the total amount of lead and tellurium) has a chemical formula according to formula 1 of $(Te_{0.02}Pb_{0.38}M_{0.6})^{n+}O_{n/2}$ and the second discrete frit with $z=0.6$ and $Te=0.95$ (where Te is the fraction amount of tellurium based on the total amount of lead and tellurium) has a chemical formula of $(Te_{0.38}Pb_{0.02}M_{0.6})^{n+}O_{n/2}$. In an embodiment, the two discrete frits are dispersed in a paste in ratios ranging from 99:1 and in ratios ranging from 1:99. During the firing process, the two discrete frits melt, fuse and combine to form a liquid phase flux with a final combined chemistry determined by the starting chemistry of the two discrete frits and by the proportion or ratio of each discrete frit dispersed in the paste.

Various combinations of individual discrete frit chemistries with chemical formulas according to formula 1 (e.g. discrete frits with $0<Te \leq 0.05$ combined with discrete frits with $0.95 \leq Te<1$) along with various proportions or ratios of the individual discrete frits dispersed in the paste can be used to design a liquid phase etching flux with various chemistries. Such a methodology may be used to precisely control the chemical compositions of the liquid phase etching flux.

In another embodiment, the discrete frits comprise a composition of formula 1 wherein $0<Te \leq 0.1$. In another embodiment, the discrete frits comprise a composition of formula 1 wherein $0.9 \leq Te<1$. The individual discrete frits are dispersed into the paste forming a paste comprising multiple discrete frits. More specifically, separate discrete frits with $0<Te \leq 0.1$ and separate discrete frits with $0.9 \leq Te<1$ are dispersed into the paste in various proportions or ratios forming a paste comprising two, three or more discrete frits mixed in various ratios.

In another embodiment, the discrete frits are mixed into a paste in ratios ranging from 99:1 to ratios ranging from 1:99 and mixtures thereof, based on the total amount of discrete frits.

In an embodiment, during the firing process the two, three or more discrete frits simultaneously melt, fuse, and combine to form a liquid phase flux with a chemistry that is a combination of the separate discrete frits. The combined chemistry is determined by the starting chemistry of the separate discrete frits (e.g., separate discrete frits with $0<Te \leq 0.1$ and separate discrete frits with $0.9 \leq Te<1$) and by the proportion or ratio of each discrete frit dispersed in the paste. The liquid phase flux with the combined chemistry of the discrete frits etches through the electrically insulating $SiN_x:H$ antireflective coating of the solar cell to make a low resistivity contact with minimal damage to the underlying silicon emitter layer.

In an example, a paste with two discrete frits wherein, one discrete frit with $z=0.6$ and $Te=0.1$ (where Te is the fraction amount of tellurium based on the total amount of lead and tellurium) has a chemical formula according to formula 1 of $(Te_{0.04}Pb_{0.36}M_{0.6})^{n+}O_{n/2}$, and the second discrete frit with $z=0.6$ and $Te=0.9$ (where Te is the fraction amount of tellurium based on the total amount of lead and tellurium) has a chemical formula of $(Te_{0.36}Pb_{0.04}M_{0.6})^{n+}O_{n/2}$. In an embodiment, the two discrete frits are dispersed in a paste in ratios ranging from 99:1 and in rations ranging from 1:99. During the firing process, the two discrete frits melt, fuse and combine to form a liquid phase flux with a final combined chemistry determined by the starting chemistry of the two discrete frits and by the proportion or ratio of each discrete frit dispersed in the paste.

Various combinations of individual discrete frit chemistries with chemical formulas according to formula 1 (e.g. discrete frits with $0<Te \leq 0.1$ combined with discrete frits with $0.9 \leq Te<1$) along with various proportions or ratios of the individual discrete frits dispersed in the paste can be used to design a liquid phase etching flux with various chemistries. Such a methodology can be used to precisely control the chemical compositions of the liquid phase etching flux.

In another embodiment, the discrete frits comprise a composition of formula 1 wherein $0<Te \leq 0.15$ in which Te is the fractional amount of tellurium based on the total amount of lead and tellurium cations. In another embodiment, the discrete frits comprise a composition of formula 1 wherein $0.85 \leq Te<1$ in which Te is the fractional amount of tellurium based on the total amount of lead and tellurium cations.

In an embodiment, the individual discrete frits are dispersed into the paste forming a paste comprising multiple discrete frits. Separate discrete frits with $0<Te \leq 0.15$ and separate discrete frits with $0.85 \leq Te<1$ are dispersed into the paste in various proportions or ratios forming a paste comprising two, three or more discrete frits mixed in various ratios.

In another embodiment, the discrete frits are mixed into a paste in ratios ranging from 99:1 to ratios ranging from 1:99 and mixtures thereof, based on the total amount of discrete frits.

In an embodiment, during the firing process the two, three or more discrete frits simultaneously melt, fuse, and combine to form a liquid phase flux with a chemistry that is a combination of the separate discrete frits. The combined chemistry is determined by the starting chemistry of the separate discrete frits (e.g., separate discrete frits with $0<Te \leq 0.15$ and separate discrete frits with $0.85 \leq Te<1$) and by the proportion or ratio of each discrete frit dispersed in the paste. The liquid phase flux with the combined chemistry of the discrete frits etches through the electrically insulating $SiN_x:H$ antireflective coating of the solar cell to make a low resistivity contact with minimal damage to the underlying silicon emitter layer.

In one example, a paste with two discrete frits wherein, one discrete frit with $z=0.6$ and $Te=0.15$ (where Te is the fraction amount of tellurium based on the total amount of lead and tellurium) has a chemical formula according to formula 1 of $(Te_{0.06}Pb_{0.34}M_{0.6})^{n+}O_{n/2}$ and the second discrete frit with z=0.6 and Te=0.85 (where Te is the fraction amount of tellurium based on the total amount of lead and tellurium) has a chemical formula of $(Te_{0.34}Pb_{0.06}M_{0.6})^{n+}O_{n/2}$. In an embodiment, the two discrete frits are dispersed in a paste in ratios ranging from 99:1 and in ratios ranging from 1:99. During the firing process, the two discrete frits melt, fuse and combine to form a liquid phase flux with a final combined chemistry determined by the starting chemistry of the two discrete frits and by the proportion or ratio of each discrete frit dispersed in the paste.

Various combinations of individual discrete frit chemistries with chemical formulas according to formula 1 (e.g. discrete frits with $0<Te\leq 0.15$ combined with discrete frits with $0.85\leq Te<1$) along with various proportions or ratios of the individual discrete frits dispersed in the paste can be used to design a liquid phase etching flux with various chemistries. Such a methodology may be used to precisely control the chemical compositions of the liquid phase etching flux.

In another embodiment, the discrete frits comprise a composition of formula 1 wherein $0<Te\leq 0.2$. In another embodiment, the discrete frits comprise a composition of formula 1 wherein $0.8\leq Te<1$. The individual discrete frits are dispersed into the paste forming a paste comprising multiple discrete frits. More specifically, separate discrete frits with $0<Te\leq 0.2$ and separate discrete frits with $0.8\leq Te<1$ are dispersed into the paste in various proportions or ratios forming a paste comprising two, three or more discrete frits mixed in various ratios.

In another embodiment, the discrete frits are mixed into a paste in ratios ranging from 99:1 to ratios ranging from 1:99 and mixtures thereof, based on the total amount of discrete frits.

In an embodiment, during the firing process the two, three or more discrete frits simultaneously melt, fuse, and combine to form a liquid phase flux with a chemistry that is a combination of the separate discrete frits. The combined chemistry is determined by the starting chemistry of the separate discrete frits (e.g., separate discrete frits with $0<Te\leq 0.2$ and separate discrete frits with $0.8\leq Te<1$) and by the proportion or ratio of each discrete frit dispersed in the paste. The liquid phase flux with the combined chemistry of the discrete frits etches through the electrically insulating $SiN_x$:H antireflective coating of the solar cell to make a low resistivity contact with minimal damage to the underlying silicon emitter layer.

In an example, a paste with two discrete frits wherein, one discrete frit with z=0.6 and Te=0.2 (where Te is the fraction amount of tellurium based on the total amount of lead and tellurium) has a chemical formula according to formula 1 of $(Te_{0.08}Pb_{0.32}M_{0.6})^{n+}O_{n/2}$, and the second discrete frit with z=0.6 and Te=0.8 (where Te is the fraction amount of tellurium based on the total amount of lead and tellurium) has a chemical formula of $(Te_{0.32}Pb_{0.08}M_{0.6})^{n+}O_{n/2}$. In an embodiment, the two discrete frits are dispersed in a paste in ratios ranging from 99:1 and in rations ranging from 1:99. During the firing process, the two discrete frits melt, fuse and combine to form a liquid phase flux with a final combined chemistry determined by the starting chemistry of the two discrete frits and by the proportion or ratio of each discrete frit dispersed in the paste. Various combinations of individual discrete frit chemistries with chemical formulas according to formula 1 (e.g. discrete frits with $0<Te\leq 0.2$ combined with discrete frits with $0.8\leq Te<1$) along with various proportions or ratios of the individual discrete frits dispersed in the paste can be used to design a liquid phase etching flux with various chemistries. Such a methodology can be used to precisely control the chemical compositions of the liquid phase etching flux.

In another embodiment, the discrete frits comprise a composition of formula 1 wherein $0<Te\leq 0.25$. In another embodiment, the discrete frits comprise a composition of formula 1 wherein $0.75\leq Te<1$. The individual discrete frits are dispersed into the paste forming a paste comprising multiple discrete frits. More specifically, separate discrete frits with $0<Te\leq 0.25$ and separate discrete frits with $0.75\leq Te<1$ are dispersed into the paste in various proportions or ratios forming a paste comprising two, three or more discrete frits mixed in various ratios.

In another embodiment, the discrete frits are mixed into a paste in ratios ranging from 99:1 to ratios ranging from 1:99 and mixtures thereof, based on the total amount of discrete frits.

In an embodiment, during the firing process the two, three or more discrete frits simultaneously melt, fuse, and combine to form a liquid phase flux with a chemistry that is a combination of the separate discrete frits. The combined chemistry is determined by the starting chemistry of the separate discrete frits (e.g., separate discrete frits with $0<Te\leq 0.25$ and separate discrete frits with $0.75\leq Te<1$) and by the proportion or ratio of each discrete frit dispersed in the paste. The liquid phase flux with the combined chemistry of the discrete frits etches through the electrically insulating $SiN_x$:H antireflective coating of the solar cell to make a low resistivity contact with minimal damage to the underlying silicon emitter layer.

In an example, a paste with two discrete frits wherein, one discrete frit with z=0.6 and Te=0.25 (where Te is the fraction amount of tellurium based on the total amount of lead and tellurium) has a chemical formula according to formula 1 of $(Te_{0.10}Pb_{0.30}M_{0.6})^{n+}O_{n/2}$, and the second discrete frit with z=0.6 and Te=0.75 (where Te is the fraction amount of tellurium based on the total amount of lead and tellurium) has a chemical formula of $(Te_{0.30}Pb_{0.10}M_{0.6})^{n+}O_{n/2}$. In an embodiment, the two discrete frits are dispersed in a paste in ratios ranging from 99:1 and in rations ranging from 1:99. During the firing process, the two discrete frits melt, fuse and combine to form a liquid phase flux with a final combined chemistry determined by the starting chemistry of the two discrete frits and by the proportion or ratio of each discrete frit dispersed in the paste.

Various combinations of individual discrete frit chemistries with chemical formulas according to formula 1 (e.g. discrete frits with $0<Te\leq 0.25$ combined with discrete frits with $0.75\leq Te<1$) along with various proportions or ratios of the individual discrete frits dispersed in the paste can be used to design a liquid phase etching flux with various chemistries. Such a methodology can be used to precisely control the chemical compositions of the liquid phase etching flux.

In another embodiment, the discrete frits comprise a composition of formula 1 wherein $0<Te\leq 0.3$. In another embodiment, the discrete frits comprise a composition of formula 1 wherein $0.7\leq Te<1$. The individual discrete frits are dispersed into the paste forming a paste comprising multiple discrete frits. More specifically, separate discrete frits with $0<Te\leq 0.3$ and separate discrete frits with $0.7\leq Te<1$ are dispersed into the paste in various proportions or ratios forming a paste comprising two, three or more discrete frits mixed in various ratios.

In another embodiment, the discrete frits are mixed into a paste in ratios ranging from 99:1 to ratios ranging from 1:99 and mixtures thereof, based on the total amount of discrete frits.

In an embodiment, during the firing process the two, three or more discrete frits simultaneously melt, fuse, and combine to form a liquid phase flux with a chemistry that is a combination of the separate discrete frits. The combined chemistry is determined by the starting chemistry of the separate discrete frits (e.g., separate discrete frits with $0<Te\leq 0.3$ and separate discrete frits with $0.7\leq Te<1$) and by the proportion or ratio of each discrete frit dispersed in the paste. The liquid phase flux with the combined chemistry of the discrete frits etches through the electrically insulating $SiN_x$:H antireflective coating of the solar cell to make a low resistivity contact with minimal damage to the underlying silicon emitter layer.

In an example, a paste with two discrete frits wherein, one discrete frit with $z=0.6$ and $Te=0.3$ (where Te is the fraction amount of tellurium based on the total amount of lead and tellurium) has a chemical formula according to formula 1 of $(Te_{0.12}Pb_{0.28}M_{0.6})^{n+}O_{n/2}$, and the second discrete frit with $z=0.6$ and $Te=0.7$ (where Te is the fraction amount of tellurium based on the total amount of lead and tellurium) has a chemical formula of $(Te_{0.28}Pb_{0.12}M_{0.6})^{n+}O_{n/2}$. In an embodiment, the two discrete frits are dispersed in a paste in ratios ranging from 99:1 and in rations ranging from 1:99. During the firing process, the two discrete frits melt, fuse and combine to form a liquid phase flux with a final combined chemistry determined by the starting chemistry of the two discrete frits and by the proportion or ratio of each discrete frit dispersed in the paste.

Various combinations of individual discrete frit chemistries with chemical formulas according to formula 1 (e.g. discrete frits with $0<Te\leq 0.3$ combined with discrete frits with $0.7\leq Te<1$) along with various proportions or ratios of the individual discrete frits dispersed in the paste can be used to design a liquid phase etching flux with various chemistries. Such a methodology can be used to precisely control the chemical compositions of the liquid phase etching flux.

In another embodiment, the discrete frits comprise a composition of formula 1 wherein $0<Te\leq 0.35$. In another embodiment, the discrete frits comprise a composition of formula 1 wherein $0.65\leq Te<1$. The individual discrete frits are dispersed into the paste forming a paste comprising multiple discrete frits. More specifically, separate discrete frits with $0<Te\leq 0.35$ and separate discrete frits with $0.65\leq Te<1$ are dispersed into the paste in various proportions or ratios forming a paste comprising two, three or more discrete frits mixed in various ratios.

In another embodiment, the discrete frits are mixed into a paste in ratios ranging from 99:1 to ratios ranging from 1:99 and mixtures thereof, based on the total amount of discrete frits.

In an embodiment, during the firing process the two, three or more discrete frits simultaneously melt, fuse, and combine to form a liquid phase flux with a chemistry that is a combination of the separate discrete frits. The combined chemistry is determined by the starting chemistry of the separate discrete frits (e.g., separate discrete frits with $0<Te\leq 0.35$ and separate discrete frits with $0.65\leq Te<1$) and by the proportion or ratio of each discrete frit dispersed in the paste. The liquid phase flux with the combined chemistry of the discrete frits etches through the electrically insulating $SiN_x$:H antireflective coating of the solar cell to make a low resistivity contact with minimal damage to the underlying silicon emitter layer.

In an example, a paste with two discrete frits wherein, one discrete frit with $z=0.6$ and $Te=0.35$ (where Te is the fraction amount of tellurium based on the total amount of lead and tellurium) has a chemical formula according to formula 1 of $(Te_{0.14}Pb_{0.26}M_{0.6})^{n+}O_{n/2}$, and the second discrete frit with $z=0.6$ and $Te=0.65$ (where Te is the fraction amount of tellurium based on the total amount of lead and tellurium) has a chemical formula of $(Te_{0.26}Pb_{0.14}M_{0.6})^{n+}O_{n/2}$. In an embodiment, the two discrete frits are dispersed in a paste in ratios ranging from 99:1 and in rations ranging from 1:99. During the firing process, the two discrete frits melt, fuse and combine to form a liquid phase flux with a final combined chemistry determined by the starting chemistry of the two discrete frits and by the proportion or ratio of each discrete frit dispersed in the paste.

Various combinations of individual discrete frit chemistries with chemical formulas according to formula 1 (e.g. discrete frits with $0<Te\leq 0.35$ combined with discrete frits with $0.65\leq Te<1$) along with various proportions or ratios of the individual discrete frits dispersed in the paste can be used to design a liquid phase etching flux with various chemistries. Such a methodology can be used to precisely control the chemical compositions of the liquid phase etching flux.

In another embodiment, the discrete frits comprise a tellurium-lead-oxygen composition of formula 1 wherein $0<Te\leq 0.4$. The discrete frits include a composition of formula 1 wherein $0.6\leq Te<1$. The individual discrete frits are dispersed into the paste forming a paste comprising multiple discrete frits. In one example, separate discrete frits with $0<Te\leq 0.4$ and separate discrete frits with $0.6\leq Te<1$ are dispersed into the paste in various proportions or ratios forming a paste comprising two, three or more discrete frits mixed in various ratios.

In another embodiment, the discrete frits are mixed into a paste in ratios ranging from 99:1 to ratios ranging from 1:99 and mixtures thereof, based on the total amount of discrete frits.

In an embodiment, during the firing process the two, three or more discrete frits simultaneously melt, fuse, and combine to form a liquid phase flux with a chemistry that is a combination of the separate discrete frits. The combined chemistry is determined by the starting chemistry of the separate discrete frits (e.g., separate discrete frits with $0<Te\leq 0.4$ and separate discrete frits with $0.6\leq Te<1$) and by the proportion or ratio of each discrete frit dispersed in the paste. The liquid phase flux with the combined chemistry of the discrete frits etches through the electrically insulating $SiN_x$:H antireflective coating of the solar cell to make a low resistivity contact with minimal damage to the underlying silicon emitter layer.

In an example, a paste with two discrete frits wherein, one discrete frit with $z=0.6$ and $Te=0.4$ (where Te is the fraction amount of tellurium based on the total amount of lead and tellurium) has a chemical formula according to formula 1 of $(Te_{0.16}Pb_{0.24}M_{0.6})^{n+}O_{n/2}$, and the second discrete frit with $z=0.6$ and $Te=0.6$ (where Te is the fraction amount of tellurium based on the total amount of lead and tellurium) has a chemical formula of $(Te_{0.24}Pb_{0.16}M_{0.6})^{n+}O_{n/2}$.

In an embodiment, the two discrete frits are dispersed in a paste in ratios ranging from 99:1 and in rations ranging from 1:99. During the firing process, the two discrete frits melt, fuse and combine to form a liquid phase flux with a final combined chemistry determined by the starting chemistry of the two discrete frits and by the proportion or ratio of each discrete frit dispersed in the paste.

Various combinations of individual discrete frit chemistries with chemical formulas according to formula 1 (e.g.

discrete frits with $0<Te\leq0.4$ combined with discrete frits with $0.6\leq Te<1$) along with various proportions or ratios of the individual discrete frits dispersed in the paste can be used to design a liquid phase etching flux with various chemistries. Such a methodology can be used to precisely control the chemical compositions of the liquid phase etching flux.

In another embodiment, the discrete frits comprise a composition of formula 1 wherein $0<Te\leq0.45$. In another embodiment, the discrete frits comprise a composition of formula 1 wherein $0.55\leq Te<1$. The individual discrete frits are dispersed into the paste forming a paste comprising multiple discrete frits. More specifically, separate discrete frits with $0<Te\leq0.45$ and separate discrete frits with $0.55\leq Te<1$ are dispersed into the paste in various proportions or ratios forming a paste comprising two, three or more discrete frits mixed in various ratios.

In another embodiment, the discrete frits are mixed into a paste in ratios ranging from 99:1 to ratios ranging from 1:99 and mixtures thereof, based on the total amount of discrete frits.

In an embodiment, during the firing process the two, three or more discrete frits simultaneously melt, fuse, and combine to form a liquid phase flux with a chemistry that is a combination of the separate discrete frits. The combined chemistry is determined by the starting chemistry of the separate discrete frits (e.g., separate discrete frits with $0<Te\leq0.45$ and separate discrete frits with $0.55\leq Te<1$) and by the proportion or ratio of each discrete frit dispersed in the paste. The liquid phase flux with the combined chemistry of the discrete frits etches through the electrically insulating $SiN_x$:H antireflective coating of the solar cell to make a low resistivity contact with minimal damage to the underlying silicon emitter layer.

Various combinations of individual discrete frit chemistries with chemical formulas according to formula 1 (e.g. discrete frits with $0<Te\leq0.45$ combined with discrete frits with $0.55\leq Te<1$) along with various proportions or ratios of the individual discrete frits dispersed in the paste can be used to design a liquid phase etching flux with various chemistries. Such a methodology can be used to precisely control the chemical compositions of the liquid phase etching flux.

In an example, a paste with two discrete frits wherein, one discrete frit with z=0.6 and Te=0.45 (where Te is the fraction amount of tellurium based on the total amount of lead and tellurium) has a chemical formula according to formula 1 of $(Te_{0.18}Pb_{0.22}M_{0.6})^{n+}O_{n/2}$, and the second discrete frit with z=0.6 and Te=0.55 (where Te is the fraction amount of tellurium based on the total amount of lead and tellurium) has a chemical formula of $(Te_{0.22}Pb_{0.18}M_{0.6})^{n+}O_{n/2}$.

In an embodiment, the two discrete frits are dispersed in a paste in ratios ranging from 99:1 and in rations ranging from 1:99. During the firing process, the two discrete frits melt, fuse and combine to form a liquid phase flux with a final combined chemistry determined by the starting chemistry of the two discrete frits and by the proportion or ratio of each discrete frit dispersed in the paste.

In another embodiment, the discrete frits comprise a composition of formula 1, wherein the individual discrete frits may be formulated with tellurium and lead ratios as shown in the tables below. That is, a discrete frit with $0<Te\leq0.05$ has a Te:Pb mole ratio=5/95 (weight ratio=3.6:96.4) and a discrete frit with $0.95\leq Te<1$ has a Te:Pb mole ratio=95/5 (weight ratio=93.1:6.9), etc. The individual discrete frits are dispersed into the paste forming a paste comprising multiple discrete frits in combinations shown in the tables below. For example, Paste 1 is a paste containing a mixture of Discrete Frit $0<Te\leq0.05$ and Discrete Frit $0.95\leq Te<1$. In addition to the pastes shown in the tables, the individual discrete frits can be combined to create pastes with other various combinations. That is, $0<Te\leq0.05$ combined with $0.8\leq Te<1$, etc. In addition, pastes can be formed with three or more frits in various combinations. In addition, the individual discrete frits can be mixed into a paste in various proportions or ratios forming a paste comprising two, three or more discrete frits mixed in various ratios.

| Paste | Discrete Frit (weight %) | Discrete Frit (weight %) |
|---|---|---|
| 1 | $0 \leq Te \leq 0.05$ ($TeO_2$:PbO = 3.6:96.4) | $0.95 \leq Te \leq 1$ ($TeO_2$:PbO = 93.1:6.9) |
| 2 | $0 \leq Te \leq 0.10$ ($TeO_2$:PbO = 7.4:92.6) | $0.90 \leq Te \leq 1$ ($TeO_2$:PbO = 86.6:13.4) |
| 3 | $0 \leq Te \leq 0.15$ ($TeO_2$:PbO = 11.2:88.8) | $0.85 \leq Te \leq 1$ ($TeO_2$:PbO = 80.2:19.8) |
| 4 | $0 \leq Te \leq 0.20$ ($TeO_2$:PbO = 15.2:84.8) | $0.80 \leq Te \leq 1$ ($TeO_2$:PbO = 74.1:25.9) |
| 5 | $0 \leq Te \leq 0.25$ ($TeO_2$:PbO = 19.2:80.8) | $0.75 \leq Te \leq 1$ ($TeO_2$:PbO = 68.2:31.8) |
| 6 | $0 \leq Te \leq 0.30$ ($TeO_2$:PbO = 23.5:76.5) | $0.70 \leq Te \leq 1$ ($TeO_2$:PbO = 62.5:37.5) |
| 7 | $0 \leq Te \leq 0.35$ ($TeO_2$:PbO = 27.8:72.7) | $0.65 \leq Te \leq 1$ ($TeO_2$:PbO = 57.0:43.0) |
| 8 | $0 \leq Te \leq 0.40$ ($TeO_2$:PbO = 32.3:67.7) | $0.60 \leq Te \leq 1$ ($TeO_2$:PbO = 51.8:48.2) |
| 9 | $0 \leq Te \leq 0.45$ ($TeO_2$:PbO = 36.9:63.1) | $0.55 \leq Te \leq 1$ ($TeO_2$:PbO = 46.6:53.4) |
| 10 | $0 \leq Te \leq 0.50$ ($TeO_2$:PbO = 41.7:58.3) | $0.50 \leq Te \leq 1$ ($TeO_2$:PbO = 41.7:58.3) |

The discrete frits can be prepared by any solid-state synthesis process by mixing appropriate quantities of starting ingredients, heating the mixture of starting ingredients in air or an oxygen containing atmosphere to a temperature where the starting ingredients react with one another to form a reaction product and then cooling the reaction product to room temperature to form a solid phase frit. The frit may be amorphous, crystalline or a mixture thereof. The frit is then ground to provide a powder of appropriate particle size for dispersing into a screen printable paste.

Figure 4:
FIG. 4 is a process flow diagram for industrial manufacturing of a screen print paste for a paste containing multiple discrete frits.

FIG. 4 is a process flow diagram 50 for industrial manufacturing of a screen print paste for a paste containing multiple discrete frits;

$$\sum_{i=1}^{n} \text{Frit } i = \text{Frit } 1 + \text{Frit } 2 + \ldots \text{Frit } n, \text{ where } i = 1$$

through n and n is the number of frits. In step 51, mix together appropriate amounts of Frit 1 starting chemical constituents. In step 52, heat (700° C.-1200° C.) Frit 1 starting chemical constituents in air or oxygen containing atmosphere to react starting ingredients. In step 53, cool (quench) Frit 1 reaction product to room temperate to form solid phase inorganic frit.

In step 54, grind (mill) Frit 1 inorganic reaction product to a D50 particle size between 0.05-10 μm. In step 55, mix together appropriate amounts of Frit 2 starting chemical constituents. In step 56, heat (700° C.-1200° C.) Frit 2 starting chemical constituents in air or oxygen containing atmosphere to react starting ingredients. In step 57, cool (quench) Frit 2 reaction product to room temperate to form solid phase inorganic frit. In step 58 grind (mill) Frit 2 inorganic reaction product to a D50 particle size between 0.05-10 μm. In step 59, mix together appropriate amounts of . . . Frit n starting chemical constituents. In step 60, heat (700° C.-1200° C.) . . . . Frit n starting chemical constituents in air or oxygen containing atmosphere to react starting ingredients. In step 61, cool (quench) . . . . Frit n reaction product to room temperate to form solid phase inorganic frit. In step 62, grind (mill) . . . . Frit n inorganic reaction product to a D50 particle size between 0.05-10 μm. In step 63, measure appropriate amounts of Frit 1+Frit 2+ . . . Frit n powders, Ag powder and organic vehicle. In step 64, blend together of Frit 1+Frit 2+ . . . Frit n powders, silver powder and organic vehicle in planetary mixer to form homogeneous paste with a viscosity between 300-600 Pa-s. In step 65, roll mill paste in a 3-roll mill to a mean FOG of approximately 10 um. In step 66, adjust paste to a final viscosity to between 200-450 Pa-s.

In one aspect, the starting ingredients are mixed together, heated to around 700° C.-1200° C. for around 0.5 hr.-2 hr. and then rapidly cooled to room temperature forming a frit. The starting ingredients may be oxides, carbonates, halides, sulfates, phosphates or salts or combinations thereof. The frit is then ground by ball milling or jet milling to a D50 particle size of about 0.05 to 10 μm, preferably to about 0.2 to 4 μm.

In an embodiment, the discrete frits comprise 0.3 to 10 weight percent based on the total solids of the screen-printable, thick film paste.

b) The Electrically Conductive Metal Powder

In another aspect, an electrically conductive metal powder for use in an electro-conductive thick-film, screen-printable paste for printing front-side electrodes on crystalline silicon solar cell emitter surfaces is disclosed.

In one embodiment, the electrically conductive metal comprises Ag, Au, Cu, Ni and alloys thereof and combinations thereof. The electrically conductive metal can be in the form of a flake, spherical, granular, powder and mixtures thereof. In one embodiment, the metal comprises silver. Silver can be in the form of silver metal, silver compounds, and mixtures thereof. Appropriate compounds include silver alloys, silver oxide ($Ag_2O$), and silver salts, such as silver chlorides, nitrates, acetates, and phosphates.

In one embodiment, the silver powder comprises 75 to 99.5 weight percent based on the total solids of the screen-printable, thick film paste.

c) The Organic Medium

In another aspect, an organic medium for use in an electro-conductive thick-film, screen-printable paste for printing front-side electrodes on crystalline silicon solar cell emitter surfaces is disclosed.

In one embodiment, the inorganic components are mixed with an organic medium to form a viscous paste having a rheology suitable for screen printing. In another embodiment, the organic medium consists of an organic solvent and one or more polymeric binders, a surfactant and a thixotropic agent and combinations thereof.

EXAMPLES

The following examples illustrate the inventions disclosed herein without limitations.

Screen Print Paste Preparation

Screen print pastes for examples 1-7 were prepared by mixing silver powder (90 wt %), frit (2 wt %) and organic components (8 wt %) in an industrial planetary mixer followed by roll milling and viscosity adjustment. Planetary mixing consisted of blending paste components until homogeneous with a viscosity between 300 and 600 Pa-s. The paste was then roll milled in a 3-roll mill to a mean fineness of grind (FOG) of approximately 5 μm in accordance with ASTM Standard Test Method D 1210-05. After 24 hours, the paste was adjusted to a final viscosity between 200 and 450 Pa-s.

d) Solar Cell Preparation

Screen print paste solar cell performance for examples 1-7 was evaluated on commercially available industrially processed, $POCl_3$ diffused n+−p-p+Si wafers with a front surface phosphorous emitter diffusion profile typically used by industry. Wafers were p-type, front junction, multi-crystalline Si pseudo-square (156 mm×156 mm, 180 μm thick) with a bulk resistivity of ~2 Ω-cm and alkaline etched, phosphorous diffused at front surface. The wafers had a 75 nm thick front-side (FS) PECVD $SiN_x$:H antireflective coating (ARC). An industrial Baccini screen printer was used to print front surface silver conductor lines. The screen was 360 mesh, 32 μm opening, with line pattern consisting of four bus bars and 103 conductor lines. The fired FS conductor line mean width was ~45-50 μm and mean line height was ~17 μm. The back side consisted of a full ground plane aluminum conductor with continuous silver tabbing bus bars. An industrial Despatch furnace was used to fire the screen printed solar cell wafers. An industrial Berger I-V tester was used to measure solar cell electrical parameters. Solar cell efficiency (Eff), fill factor (FF), open circuit voltage (Voc), short circuit current (Isc) and series resistance (Rs) are shown in Table 6. The electrical data values are median values for about 10 solar cells.

Example 1

Frit 1: x=0.05 and Frit 2: x=0.95

Three exemplary electro-conductive thick-film pastes (Pastes 1-3) were prepared using a multiple discrete frit system containing Frit 1 and Frit 2. Frit 1 and Frit 2 had a tellurium-lead-metal-oxygen composition according to

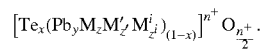

Frit 1 had x=0.05 where x is the fractional amount of tellurium cation (Te) based on the total amount of tellurium and lead cations (Pb), and z=0.315 where z is the fractional amount of metal cations (M) based on the total amount of tellurium, lead, and metal cations. Frit 2 had x=0.95 and z=0.315. Frit 1 and Frit 2 contained metal cations (M) selected from Al, Bi, B, Ca, Li, Mg, Na, Si, Ti, W and Zn. Table 1 shows the compositions of Frit 1 and Frit 2. Pastes 1-3 contained Frit 1 and Frit 2 in mixture ratios shown in Table 5.1. Paste 1 contained a 45:55 ratio of Frit 1 and Frit 2. Pastes 2 and 3 are comparison examples that contained only a single discrete frit.

Table 6 shows solar cell electrical data. Solar cells prepared with Paste 1, which contained a mixture of Frit 1 and Frit 2, had excellent electrical performance and superior electrical performance compared to solar cells prepared with Paste 2, which contained only Frit 1, and solar cells prepared from Paste 3, which contained only Frit 2. The electrical data shows that solar cells prepared with a paste containing a mixture of multiple discrete frits (Paste 1) had excellent solar cell electrical performance and superior electrical performance compared to solar cells prepared with pastes containing only a single frit (comparison example Paste 2 and comparison example Paste 3).

Example 2

Frit 3: x=0.10 and Frit 4: x=0.90

Three exemplary electroconductive thick-film pastes (Pastes 4-6) were prepared using a multiple discrete frit system containing Frit 3 and Frit 4. Frit 3 and Frit 4 had a tellurium-lead-metal-oxygen composition according to

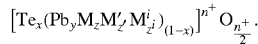

Frit 3 had x=0.10 where x is the fractional amount of tellurium cations (Te) based on the total amount of tellurium and lead cations (Pb), and z=0.315 where z is the fractional amount of metal cations (M) based on the total amount of tellurium, lead, and metal cations. Frit 3 had x=0.90 and z=0.315. Frit 3 and Frit 4 contained metal cations (M) selected from Al, Bi, B, Ca, Li, Mg, Na, Si, Ti, W and Zn. Table 2 shows the compositions of Frit 3 and Frit 4. Pastes 4-6 contained Frit 3 and Frit 4 in mixture ratios shown in Table 5.1. Paste 4 contained a 43:57 ratio of Frit 3 and Frit 4. Pastes 5 and 6 are comparison examples that contained only a single discrete frit.

Table 6 shows solar cell electrical data. Solar cells prepared with Paste 4, which contained a mixture of Frit 3 and Frit 4, had excellent electrical performance and superior electrical performance compared to solar cells prepared with Paste 5, which contained only Frit 3, and solar cells prepared from Paste 6, which contained only Frit 4. The electrical data shows that solar cells prepared with a paste containing a mixture of multiple discrete frits (Paste 4) had excellent superior solar cell electrical performance and superior electrical performance compared to solar cells prepared with pastes containing only a single frit (comparison example Paste 5 and comparison example Paste 6).

Example 3

Frit 1: x=0.15 and Frit 2: x=0.85

Three exemplary electro-conductive thick-film pastes (Pastes 7-9) were prepared using a multiple discrete frit system containing Frit 5 and Frit 6. Frit 5 and Frit 6 had a tellurium-lead-metal-oxygen composition according to

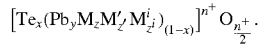

Frit 5 had x=0.15 where x is the fractional amount of tellurium cations (Te) based on the total amount of tellurium and lead cations (Pb), and z=0.315 where z is the fractional amount of metal cations (M) based on the total amount of tellurium, lead, and metal cations. Frit 6 had x=0.85 and z=0.315. Frit 5 and Frit 6 contained metal cations (M) selected from Al, Bi, B, Ca, Li, Mg, Na, Si, Ti, W and Zn. Table 3 shows the compositions of Frit 5 and Frit 6. Pastes 7-9 contained Frit 5 and Frit 6 in mixture ratios shown in Table 5.1. Paste 7 contained a 40:60 ratio of Frit 5 and Frit 6. Pastes 8 and 9 are comparison examples that contained only a single discrete frit.

Table 6 shows solar cell electrical data. Solar cells prepared with Paste 7, which contained a mixture of Frit 5 and Frit 6, had excellent electrical performance and superior electrical performance compared to solar cells prepared with Paste 8, which contained only Frit 5, and solar cells prepared from Paste 9, which contained only Frit 6. The electrical data shows that solar cells prepared with a paste containing a mixture of multiple discrete frits (Paste 7) had excellent solar cell electrical performance and superior electrical performance compared to solar cells prepared with pastes containing only a single frit (comparison example Paste 8 and comparison example Paste 9).

Example 4

Frit 1: x=0.05, Frit 2: x=0.95 and Frit 3: x=0.10

Four exemplary electro-conductive thick-film pastes (Pastes 10, 2, 3 and 5) were prepared using a multiple discrete frit system containing Frit 1, Frit 2 and Frit 3. Frit 1, Frit 2 and Frit 3 had a tellurium-lead-metal-oxygen composition according to

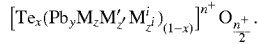

Frit 1 had x=0.05 where x is the fractional amount of tellurium cations (Te) based on the total amount of tellurium and lead cations (Pb), and z=0.315, where z is the fractional amount of metal cations (M) based on the total amount of tellurium, lead, and metal cations. Frit 2 had x=0.95 and z=0.315. Frit 3 had x=0.10 and z=0.315. Frit 1, Frit 2 and Frit 3 contained metal cations (M) selected from Al, Bi, B, Ca, Li, Mg, Na, Si, Ti, W and Zn. Tables 1 and 2 show the compositions of Frit 1, Frit 2 and Frit 3. Pastes 10, 2, 3 and 5 contained Frit 1, Frit 2 and Frit 3 in mixture ratios shown in Table 5.1. Paste 10 contained a 23:54:23 ratio of Frit 1, Frit 2 and Frit 3, respectively. Pastes 2, 3 and 5 are comparison examples that contained only a single discrete frit.

Table 6 shows solar cell electrical data. Solar cells prepared with Paste 10, which contained a mixture of Frit 1, Frit 2 and Frit 3 had excellent electrical performance and superior electrical performance compared to solar cells prepared with Paste 2, which contained only Frit 1, solar cells prepared from Paste 3, which contained only Frit 2 and solar cells prepared from Paste 5, which contained only Frit 3. The electrical data shows that solar cells prepared with a paste containing a mixture of multiple discrete frits (Paste 10) had excellent solar cell electrical performance and superior electrical performance compared to solar cells prepared with pastes containing only a single frit (comparison example Paste 2, comparison example Paste 3 and comparison example Paste 5).

Example 5

Frit 1: x=0.05, Frit 2: x=0.95 Frit 3: x=0.10, Frit 5: x=15

Five exemplary electro-conductive thick-film pastes (Pastes 11, 2, 3, 5 and 8) were prepared using a multiple discrete frit system containing Frit 1, Frit 2, Frit 3 and Frit 5. Frit 1, Frit 2, Frit 3 and Frit 5 had a tellurium-lead-metal-oxygen composition according to

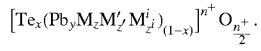

Frit 1 had x=0.05, where x is the fractional amount of tellurium cations (Te) based on the total amount of tellurium and lead cations (Pb), and z=0.315 where z is the fractional amount of metal cations (M) based on the total amount of tellurium, lead, and metal cations. Frit 2 had x=0.95 and z=0.315. Frit 3 had x=0.10 and z=0.315. Frit 5 had x=0.15 and z=0.315. Frit 1 Frit 2, Frit 3 and Frit 5 contained metal cations (M) selected from Al, Bi, B, Ca, Li, Mg, Na, Si, Ti, W and Zn. Tables 1, 2 and 3 show the compositions of Frit 1 Frit 2, Frit 3 and Frit 5. Pastes 11, 2, 3, 5 and 8 contained Frit 1 Frit 2, Frit 3 and Frit 5 in mixture ratios shown in Table 5.1. Paste 11 contained a 16:54:16:16 ratio of Frit 1 Frit 2, Frit 3 and Frit 5, respectively. Pastes 2, 3, 5 and 8 are comparison examples that contained only a single discrete frit.

Table 6 shows solar cell electrical data. Solar cells prepared with Paste 11, which contained a mixture of Frit 1, Frit 2, Frit 3 and Frit 5 had excellent electrical performance and superior electrical performance compared to solar cells prepared with Paste 2, which contained only Frit 1, solar cells prepared from Paste 3, which contained only Frit 2, solar cells prepared from Paste 5.1, which contained only Frit 3 and solar cells prepared from Paste 5, which contained only Frit 5. The electrical data shows that solar cells prepared with a paste containing a mixture of multiple discrete frits (Paste 11) excellent solar cell electrical performance and superior electrical performance compared to solar cells prepared with pastes containing only a single frit (comparison example Paste 2, comparison example Paste 3, comparison example Paste 5 and comparison example Paste 8).

Example 6

Frit 1: x=0.05, Frit 2: x=0.95 Frit 4: x=0.90, Frit 6: x=85

Five exemplary electroconductive thick-film pastes (Pastes 12, 2, 3, 6 and 9) were prepared using a multiple discrete frit system containing Frit 1, Frit 2, Frit 4 and Frit 6. Frit 1, Frit 2, Frit 4 and Frit 6 had a tellurium-lead-metal-oxygen composition according to

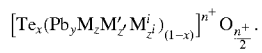

Frit 1 had x=0.05 where x is the fractional amount of tellurium cations (Te) based on the total amount of tellurium and lead cations (Pb), and z=0.315 where z is the fractional amount of metal cations (M) based on the total amount of tellurium, lead, and metal cations such that Te=0.05 and Pb=0.95 (i.e., the ratio of Te:Pb is 5:95). Frit 2 had x=0.95 and z=0.315 such that Te=0.95 and Pb=0.05 (i.e., the ratio of Te:Pb is 95:5). Frit 4 had x=0.90 and z=0.315 such that Te=0.90 and Pb=0.10 (i.e., the ratio of Te:Pb is 90:10). Frit 6 had x=0.85 and z=0.315 such that Te=0.85 and Pb=0.15 (i.e., the ratio of Te:Pb is 85:15). Frit 1, Frit 2, Frit 4 and Frit 6 contained metal cations (M) selected from Al, Bi, B, Ca, Li, Mg, Na, Si, Ti, W and Zn. Tables 1, 2 and 3 show the compositions of Frit 1, Frit 2, Frit 4 and Frit 6. Pastes 12, 2, 3, 5 and 9 contained Frit 1, Frit 2, Frit 4 and Frit 6 in mixture ratios shown in Table 5.1. Paste 12 contained a 41:19.66:19.66:19.66 ratio of Frit 1, Frit 2, Frit 4 and Frit 6, respectively. Pastes 2, 3, 6 and 9 are comparison examples that contained only a single discrete frit.

Table 6 shows solar cell electrical data. Solar cells prepared with Paste 12, which contained a mixture of Frit 1, Frit 2, Frit 4 and Frit 6 had excellent electrical performance and superior electrical performance compared to solar cells prepared with Paste 2, which contained only Frit 1, solar cells prepared from Paste 3, which contained only Frit 2, solar cells prepared from Paste 6, which contained only Frit 4 and solar cells prepared from Paste 9, which contained only Frit 6. The electrical data shows that solar cells prepared with a paste containing a mixture of multiple discrete frits (Paste 12) had excellent solar cell electrical performance and superior electrical performance compared to solar cells prepared with pastes containing only a single frit (comparison example Paste 2, comparison example Paste 3, comparison example Paste 6 and comparison example Paste 9).

Comparison Example 7

Example 7 is a comparative example for a paste (Comparison Paste 13) that contains two discrete frits where one frit is lead-free (Comparison Frit 7) and the second frit (Comparison Frit 8) contains both tellurium and lead. Comparison Paste 13 is a typical prior art two frit paste where one frit is lead-free and the second frit contains tellurium and lead. Comparative Example 7 shows that a two frit paste where one frit is lead-free and the second frit contains both tellurium and lead did not perform as well as the two frit pastes of the invention where both frits contain tellurium and lead (Paste 1, Paste 4, and Paste 7) or perform as well as the multiple frit pastes (more than two frits) of the invention where all frits contain tellurium and lead (Paste 10, Paste 11, and Paste 12). This example clearly shows the performance advantage for frits of the invention where all frits in the pastes contain tellurium and lead. It is essential to know that such an advantage is necessary to advance solar cell performance where the performance improvement metric is tenths of a percent absolute efficiency as discussed previously.

Table 4 shows the compositions of Comparison Frit 7 and Comparison Frit 8. Comparison Paste 13 contained Comparison Frit 7 and Comparison Frit 8 in the mixture ratio shown in Table 5.2. Table 6 shows solar cell electrical data. Solar cells prepared with comparison Paste 13, which contained a mixture of Comparison Frit 7 and Comparison Frit 8 had poor electrical performance compared to solar cells prepared from pastes containing frits of the invention (Paste 1, Paste 4, Paste 7, Paste 10, Paste 11 and Paste 12).

TABLE 1

Compositions of Frit 1 and Frit 2

| $[Te_x(Pb_yM_zM'_{z'}M^i_{z^i})_{(1-x)}]^{n+}O_{\frac{n+}{2}}$ | Frit 1 x/(x + y) = 0.05 | Frit 2 x/(x + y) = 0.95 |
|---|---|---|
| Te (cation %) | 3.425 | 65.075 |
| Pb (cation %) | 65.075 | 3.425 |
| M (cation %) | 31.50 | 31.50 |

M selected from Al, Bi, B, Ca, Li, Mg, Na, Si, Ti, W and Zn

TABLE 2

Compositions of Frit 3 and Frit 4

| $\left[Te_x(Pb_yM_zM'_{z'}M^i_{z^i})_{(1-x)}\right]^{n+}O_{\frac{n+}{2}}$ | Frit 3<br>x/(x + y) = 0.10 | Frit 4<br>x/(x + y) = 0.90 |
|---|---|---|
| Te (cation %) | 6.85 | 61.65 |
| Pb (cation %) | 61.65 | 6.85 |
| M (cation %) | 31.50 | 31.50 |

M selected from Al, Bi, B, Ca, Li, Mg, Na, Si, Ti, W and Zn

TABLE 3

Compositions of Frit 5 and Frit 6

| $\left[Te_x(Pb_yM_zM'_{z'}M^i_{z^i})_{(1-x)}\right]^{n+}O_{\frac{n+}{2}}$ | Frit 5<br>x/(x + y) = 0.15 | Frit 6<br>x/(x + y) = 0.85 |
|---|---|---|
| Te (cation %) | 10.275 | 58.228 |
| Pb (cation %) | 58.228 | 10.275 |
| M (cation %) | 31.50 | 31.50 |

M selected from Al, Bi, B, Ca, Li, Mg, Na, Si, Ti, W and Zn

TABLE 4

Compositions of Comparison Frit 7 and Comparison Frit 8

| Cations | Comparison<br>Frit 7 | Comparison<br>Frit 8 |
|---|---|---|
| Te (cation %) | 12.20 | 65.10 |
| Pb (cation %) | | 26.30 |
| Bi (cation %) | 35.30 | |
| Li (cation %) | | 4.50 |
| W (cation %) | 5.80 | |
| Zn (cation %) | 29.30 | 4.10 |
| Si (cation %) | 17.40 | |

TABLE 5.1

Mixture Ratio (weight %) of Frits in Paste

| | | Frit 1<br>Te:Pb = 5:95 | Frit 2<br>Te:Pb = 95:5 | Frit 3<br>Te:Pb = 10:90 | Frit 4<br>Te:Pb = 90:10 | Frit 5<br>Te:Pb = 15:85 | Frit 6<br>Te:Pb = 85:15 |
|---|---|---|---|---|---|---|---|
| Example 1 | Paste 1 | 45 | 55 | | | | |
| | Paste 2 | 100 | | | | | |
| | Paste 3 | | 100 | | | | |
| Example 2 | Paste 4 | | | 43 | 57 | | |
| | Paste 5 | | | 100 | | | |
| | Paste 6 | | | | 100 | | |
| Example 3 | Paste 7 | | | | | 40 | 60 |
| | Paste 8 | | | | | 100 | |
| | Paste 9 | | | | | | 100 |
| Example 4 | Paste 10 | 23 | 54 | 23 | | | |
| | Paste 2 | 100 | | | | | |
| | Paste 3 | | 100 | | | | |
| | Paste 5 | | | 100 | | | |
| Example 5 | Paste 11 | 15.66 | 53 | 15.66 | | 15.66 | |
| | Paste 2 | 100 | | | | | |
| | Paste 3 | | 100 | | | | |
| | Paste 5 | | | 100 | | | |
| | Paste 8 | | | | | 100 | |
| Example 6 | Paste 12 | 41.00 | 19.66 | | 19.66 | | 19.66 |
| | Paste 2 | 100 | | | | | |
| | Paste 3 | | 100 | | | | |
| | Paste 6 | | | | 100 | | |
| | Paste 9 | | | | | | 100 |

TABLE 5.2

Mixture Ratio (weight %) of Frits in Paste

| | | Comparison<br>Frit 7 | Comparison<br>Frit 8 |
|---|---|---|---|
| Comparison<br>Example 7 | Comparison<br>Paste 13 | 80 | 20 |

TABLE 6

Solar Cell Electrical Data

| | | Eff (%) | FF (%) | Voc (mV) | Isc (mA) | Rs (mΩ) |
|---|---|---|---|---|---|---|
| Example 1 | Paste 1 | 18.30 | 78.91 | 629 | 8.55 | 1.81 |
| | Paste 2 | 8.06 | 36.50 | 616 | 8.28 | 44.92 |
| | Paste 3 | 1.98 | 26.99 | 531 | 3.04 | 109.87 |
| Example 2 | Paste 4 | 18.21 | 78.98 | 634 | 8.86 | 2.01 |
| | Paste 5 | 3.43 | 30.40 | 614 | 4.79 | 81.92 |
| | Paste 6 | 3.47 | 30.56 | 613 | 4.62 | 84.47 |
| Example 3 | Paste 7 | 18.26 | 78.70 | 635 | 8.91 | 1.88 |
| | Paste 8 | 6.03 | 30.66 | 617 | 7.73 | 58.10 |
| | Paste 9 | 7.59 | 38.42 | 619 | 8.80 | 42.70 |
| Example 4 | Paste 10 | 18.27 | 78.66 | 636 | 9.96 | 2.00 |
| | Paste 2 | 8.06 | 36.50 | 616 | 8.28 | 44.92 |
| | Paste 3 | 1.98 | 26.99 | 531 | 3.04 | 109.87 |
| | Paste 5 | 3.43 | 30.40 | 614 | 4.79 | 81.92 |
| Example 5 | Paste 11 | 18.10 | 77.83 | 632 | 8.96 | 2.54 |
| | Paste 2 | 8.06 | 36.50 | 616 | 8.28 | 44.92 |
| | Paste 3 | 1.98 | 26.99 | 531 | 3.04 | 109.87 |
| | Paste 5 | 3.43 | 30.40 | 614 | 4.79 | 81.92 |
| | Paste 8 | 6.03 | 30.66 | 617 | 7.73 | 58.10 |
| Example 6 | Paste 12 | 18.34 | 78.79 | 632 | 8.96 | 1.90 |
| | Paste 2 | 8.06 | 36.50 | 616 | 8.28 | 44.92 |
| | Paste 3 | 1.98 | 26.99 | 531 | 3.04 | 109.87 |
| | Paste 6 | 3.47 | 30.56 | 613 | 4.62 | 84.47 |
| | Paste 9 | 7.59 | 38.42 | 619 | 8.80 | 42.70 |
| Comparison<br>Example 7 | Paste 13 | 1.92 | 25.56 | 551 | 3.15 | 59.19 |

The present invention or any part(s) or function(s) thereof, may be implemented using hardware, software, or a combination thereof, and may be implemented in one or more computer systems or other processing systems. A computer system for performing the operations of the present invention and capable of carrying out the functionality described herein can include one or more processors connected to a communications infrastructure (e.g., a communications bus, a cross-over bar, or a network). Various software embodiments are described in terms of such an exemplary computer system. After reading this description, it will become apparent to a person skilled in the relevant art(s) how to implement the invention using other computer systems and/or architectures.

The foregoing description of the preferred embodiments of the present invention has been presented for purposes of illustration and description. It is not intended to be exhaustive or to limit the invention to the precise form or to exemplary embodiments disclosed. Obviously, many modifications and variations will be apparent to practitioners skilled in this art. Similarly, any process steps described might be interchangeable with other steps in order to achieve the same result. The embodiment was chosen and described in order to best explain the principles of the invention and its best mode practical application, thereby to enable others skilled in the art to understand the invention for various embodiments and with various modifications as are suited to the particular use or implementation contemplated. It is intended that the scope of the invention be defined by the claims appended hereto and their equivalents. Reference to an element in the singular is not intended to mean "one and only one" unless explicitly so stated, but rather means "one or more." Moreover, no element, component, nor method step in the present disclosure is intended to be dedicated to the public regardless of whether the element, component, or method step is explicitly recited in the following claims. No claim element herein is to be construed under the provisions of 35 U.S.C. Sec. 112, sixth paragraph, unless the element is expressly recited using the phrase "means for . . . ."

Furthermore, the purpose of the foregoing Abstract is to enable the U.S. Patent and Trademark Office and the public generally, and especially the scientists, engineers and practitioners in the art who are not familiar with patent or legal terms or phraseology, to determine quickly from a cursory inspection the nature and essence of the technical disclosure of the application. The Abstract is not intended to be limiting as to the scope of the present invention in any way. It is also to be understood that the steps and processes recited in the claims need not be performed in the order presented.

The invention claimed is:

1. An electro-conductive thick-film, screen-printable paste comprising:
   an inorganic frit system including a first discrete frit including lead (Pb) and tellurium (Te);
   a second discrete frit including lead and tellurium;
      wherein the inorganic frit system includes a mixture in which the first discrete frit includes $0<Te\leq0.40$ and the second discrete frit includes $0.60\leq Te<1$ wherein Te is the mole fraction of tellurium cations based on a total number of moles of lead and tellurium cations in each respective discrete frit.

2. The paste of claim 1 further comprising more than two discrete frits.

3. The paste of claim 1 further comprising a conductive metal powder.

4. The paste of claim 1, wherein the tellurium is a tellurium oxide and the lead is a lead oxide.

5. The paste of claim 1, wherein one or more of the discrete frits comprise 0.3 to 10 weight percent based on a total amount of solids in the paste.

6. The paste of claim 1, wherein the first discrete frit and second discrete frit are mixed in ratios ranging from 99:1 to ratios ranging from 1:99 and mixtures thereof based on a total amount of discrete frits in the paste.

7. The paste of claim 1, wherein the first discrete frit and the second frit comprise a tellurium-lead-metal-oxygen composition of

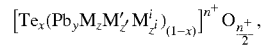

wherein $0<z\leq0.6$ and z is the mole fraction of metal (M) cations based on the total number of moles of lead, tellurium and metal cations, respectively, selected from one of Li, Na, K, Rb, Cs, Mg, Ca, Sr, Ba, B, Al, Si, P, Sc, Ti, Cr, Mn, Fe, Co, Ni, Cu Zn, Ga, Ge, Y, Zr, Nb, Mo, Ru, Pd, Ag, In, Sn, Sb, Hf, Ta, W, Pt, Au, Bi, La and the other lanthanide elements and mixtures thereof, wherein the metal cations comprise oxides, halides or fluorides.

8. The paste of claim 1, wherein the inorganic frit system comprises metal cations including one of oxides, halides and fluorides.

9. The paste of claim 3, wherein the powder comprises at least a portion of silver.

10. The paste of claim 9, further comprising a silver powder content from 75 to 99.5 weight percent based on a total amount of solids in the paste.

11. The paste of claim 1, further comprising an organic medium including one of an organic vehicle and additive.

12. At least one photovoltaic cell having been formed using an electro-conductive thick-film, screen-printable paste comprising an inorganic frit system including a first discrete frit including lead (Pb) and tellurium (Te); a second discrete frit including lead and tellurium; wherein the inorganic frit system includes a mixture in which the first discrete frit includes $0<Te\leq0.40$ and the second discrete frit includes $0.60\leq Te<1$ wherein Te is the mole fraction of tellurium cations based on a total number of moles of lead and tellurium cations in each respective discrete frit.

13. The cell of claim 12, wherein the first discrete frit and the second frit comprise a tellurium-lead-metal-oxygen composition of

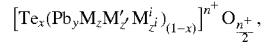

wherein $0<z\leq0.6$ and z is the mole fraction of metal (M) cations based on the total number of moles of lead, tellurium and metal cations, respectively, selected from one of Li, Na, K, Rb, Cs, Mg, Ca, Sr, Ba, B, Al, Si, P, Sc, Ti, Cr, Mn, Fe, Co, Ni, Cu Zn, Ga, Ge, Y, Zr, Nb, Mo, Ru, Pd, Ag, In, Sn, Sb, Hf, Ta, W, Pt, Au, Bi, La and the other lanthanide elements and mixtures thereof, wherein the metal cations comprise oxides, halides or fluorides.

14. The cell of claim 12, further comprising an emitter surface that is lightly doped with high sheet resistance.

15. The cell of claim 12, further comprising a conductive metal powder wherein the powder comprises at least a portion of silver.

16. The cell of claim 12, wherein one or more of the discrete frits comprise 0.3 to 10 weight percent based on a total amount of solids of the paste.

17. A photovoltaic module comprising the cell of claim 12.

18. The cell of claim 12 wherein the tellurium is a tellurium oxide and the lead is a lead oxide.

19. The cell of claim 12 further comprising two or more discrete frits.

20. The cell of claim 12, wherein the first discrete frit and second discrete frit are mixed in ratios ranging from 99:1 to ratios ranging from 1:99 and mixtures thereof based on a total amount of discrete frits in the paste.

* * * * *